United States Patent
Ujita et al.

(10) Patent No.: US 10,686,042 B2
(45) Date of Patent: Jun. 16, 2020

(54) SEMICONDUCTOR DEVICE

(71) Applicant: Panasonic Corporation, Osaka (JP)

(72) Inventors: Shinji Ujita, Osaka (JP); Daisuke Shibata, Kyoto (JP); Satoshi Tamura, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 16/055,580

(22) Filed: Aug. 6, 2018

(65) Prior Publication Data

US 2018/0350917 A1    Dec. 6, 2018

Related U.S. Application Data

(63) Continuation of application No. PCT/JP2017/003274, filed on Jan. 31, 2017.

(30) Foreign Application Priority Data

Feb. 8, 2016    (JP) ................................ 2016-021436

(51) Int. Cl.
*H01L 29/20*    (2006.01)
*H01L 29/78*    (2006.01)
(Continued)

(52) U.S. Cl.
CPC .. *H01L 29/2003* (2013.01); *H01L 21/823487* (2013.01); *H01L 27/088* (2013.01);
(Continued)

(58) Field of Classification Search
CPC ......... H01L 29/2003; H01L 21/823487; H01L 27/09
(Continued)

(56) References Cited

U.S. PATENT DOCUMENTS 5,406,094 A * 4/1995 Arimoto ................ B82Y 10/00
257/12
5,804,863 A * 9/1998 Rhee ...................... B82Y 10/00
257/401
(Continued)

FOREIGN PATENT DOCUMENTS

JP    2006-286910 A    10/2006
JP    2011-155221 A    8/2011
(Continued)

OTHER PUBLICATIONS

Written Opinion and International Search Report dated Apr. 18, 2017 issued in International Patent Application No. PCT/JP2017/003274 (with English translation).

*Primary Examiner* — Sheikh Maruf
(74) *Attorney, Agent, or Firm* — McDermott Will & Emery LLP

(57) ABSTRACT

A semiconductor device includes: a substrate; a first nitride semiconductor layer disposed on the substrate; a second nitride semiconductor layer disposed on the first nitride semiconductor layer; a first opening penetrating the second nitride semiconductor layer; an electron transit layer and an electron supply layer which are formed along an upper surface of the second nitride semiconductor layer and a recessed surface of the first opening; a gate electrode disposed above the electron supply layer; a second opening penetrating the electron supply layer and the electron transit layer; a source electrode disposed to cover the second opening and electrically connected to the second nitride semiconductor layer; and a drain electrode disposed on a back surface of the substrate. The electron supply layer has a side surface formed along a side surface of the first opening. The gate electrode is not disposed on the side surface of the electron supply layer.

7 Claims, 7 Drawing Sheets

(51) Int. Cl.
*H01L 21/82* (2006.01)
*H01L 27/088* (2006.01)
*H01L 29/423* (2006.01)
*H01L 29/778* (2006.01)
*H01L 27/098* (2006.01)
*H01L 21/8234* (2006.01)
*H01L 29/417* (2006.01)
*H01L 29/10* (2006.01)
*H01L 29/06* (2006.01)

(52) U.S. Cl.
CPC ...... *H01L 27/098* (2013.01); *H01L 29/42356* (2013.01); *H01L 29/7787* (2013.01); *H01L 29/7788* (2013.01); *H01L 29/7789* (2013.01); *H01L 29/7802* (2013.01); *H01L 29/0623* (2013.01); *H01L 29/1066* (2013.01); *H01L 29/41741* (2013.01); *H01L 29/41766* (2013.01); *H01L 29/4238* (2013.01)

(58) Field of Classification Search
USPC ......................................................... 438/401
See application file for complete search history.

(56) References Cited

U.S. PATENT DOCUMENTS

| | | | | |
|---|---|---|---|---|
| 7,592,647 | B2* | 9/2009 | Nakata | H01L 29/42316 257/192 |
| 2003/0089930 | A1* | 5/2003 | Zhao | H01L 29/42316 257/256 |
| 2005/0159000 | A1* | 7/2005 | Ohno | H01L 21/30612 438/689 |
| 2006/0091430 | A1* | 5/2006 | Sriram | H01L 29/4175 257/280 |
| 2006/0118824 | A1* | 6/2006 | Otsuka | H01L 29/7787 257/194 |
| 2006/0219997 | A1* | 10/2006 | Kawasaki | H01L 29/7789 257/12 |
| 2006/0220042 | A1* | 10/2006 | Yaegashi | H01L 21/28575 257/94 |
| 2006/0220060 | A1* | 10/2006 | Nakata | H01L 29/42316 257/189 |
| 2009/0194790 | A1* | 8/2009 | Sato | H01L 29/7789 257/192 |
| 2009/0278197 | A1* | 11/2009 | Ohta | H01L 21/28587 257/330 |
| 2009/0321854 | A1* | 12/2009 | Ohta | H01L 27/0605 257/411 |
| 2011/0241017 | A1* | 10/2011 | Ikeda | H01L 29/7787 257/76 |
| 2012/0313163 | A1* | 12/2012 | Fukui | H01L 29/41741 257/330 |
| 2013/0032811 | A1* | 2/2013 | Kizilyalli | H01L 29/66924 257/76 |
| 2013/0049137 | A1* | 2/2013 | Uno | H01L 27/088 257/401 |
| 2013/0175538 | A1* | 7/2013 | Choi | H01L 29/7813 257/76 |
| 2013/0221434 | A1* | 8/2013 | Okada | H01L 29/407 257/330 |
| 2013/0234156 | A1* | 9/2013 | Okada | H01L 29/66462 257/76 |
| 2013/0341645 | A1* | 12/2013 | Hayashi | H01L 29/1608 257/77 |
| 2014/0197487 | A1* | 7/2014 | Cascino | H01L 29/41766 257/337 |
| 2014/0203329 | A1* | 7/2014 | Saitoh | H01L 29/66462 257/194 |
| 2016/0049486 | A1* | 2/2016 | Blank | H01L 21/3083 257/330 |
| 2016/0254385 | A1* | 9/2016 | Wen | H01L 29/7856 257/401 |
| 2016/0260827 | A1* | 9/2016 | Nishimori | H01L 29/1075 |
| 2016/0329421 | A1* | 11/2016 | Shibata | H01L 29/861 |
| 2017/0047412 | A1* | 2/2017 | Tanaka | H01L 29/4236 |

FOREIGN PATENT DOCUMENTS

| | | | |
|---|---|---|---|
| JP | 2011155221 A | * | 8/2011 |
| JP | 2012-104567 A | | 5/2012 |
| JP | 2012104567 A | * | 5/2012 |
| WO | 2015/122135 A1 | | 8/2015 |

* cited by examiner

SEMICONDUCTOR DEVICE

CROSS REFERENCE TO RELATED APPLICATIONS

This application is a U.S. continuation application of PCT International Patent Application Number PCT/JP2017/003274 filed on Jan. 31, 2017, claiming the benefit of priority of Japanese Patent Application Number 2016-021436 filed on Feb. 8, 2016, the entire contents of which are hereby incorporated by reference.

BACKGROUND

1. Technical Field

The present disclosure relates to a semiconductor device which functions as a transistor.

2. Description of the Related Art

A semiconductor device, such as a transistor, that is formed from a nitride semiconductor expressed by a general formula $Al_xGa_{1-x-y}In_yN$ (where $0 \le x \le 1$, $0 \le y \le 1$) has a low on-resistance, a high breakdown voltage, and excellent pinch-off characteristics. On this account, expectations are growing that a transistor formed from a nitride semiconductor can be used as a power transistor in, for example, a power supply circuit of a television set or other consumer equipment. As an example of such a transistor, a vertical transistor disclosed in Japanese Unexamined Patent Application Publication No. 2012-104567 (PTL 1) is known, for instance.

SUMMARY

However, the semiconductor device disclosed in PTL 1 needs a high gate drive voltage and, for this reason, causes an increase in drive loss to drive the device.

In view of the aforementioned problem, the present disclosure has an object to provide a semiconductor device that can reduce drive loss.

To solve the aforementioned problem, a semiconductor device according to an aspect of the present disclosure includes: a substrate which has a first main surface on one side and a second main surface on an opposite side, and which is of a first conductivity type; a first nitride semiconductor layer which is disposed on the first main surface of the substrate; a second nitride semiconductor layer which is disposed on the first nitride semiconductor layer; a first opening which has a recessed shape and penetrates the second nitride semiconductor layer to reach the first nitride semiconductor layer; an electron transit layer including a nitride semiconductor and disposed above the substrate, and a first electron supply layer including a nitride semiconductor and disposed on the electron transit layer, the electron transit layer and the first electron supply layer covering an upper surface of the second nitride semiconductor layer and the first opening and being formed along the upper surface of the second nitride semiconductor layer and a recessed surface of the first opening; a gate electrode which is disposed above the first electron supply layer; a second opening which is disposed separately from the gate electrode, has a recessed shape, and penetrates the first electron supply layer and the electron transit layer to reach the second nitride semiconductor layer; a source electrode which is disposed to cover the second opening and electrically connected to the second nitride semiconductor layer; and a drain electrode which is disposed on the second main surface of the substrate. The first electron supply layer has an upper surface which is approximately parallel to the first main surface and a side surface which is formed along a side surface of the first opening. The gate electrode is disposed selectively on the upper surface of the first electron supply layer and not disposed on the side surface of the first electron supply layer.

With this configuration, the semiconductor device according to the present aspect includes the gate electrode that is formed selectively on the upper surface of the first electron supply layer and not formed on the side surface of the first electron supply layer. Thus, an on-off operation of the semiconductor device is performed only by the electron transit layer located straight down from the gate electrode. This can reduce the gate drive voltage of the semiconductor device and thereby reduce the drive loss of the semiconductor device.

With the semiconductor device according to the present disclosure, drive loss can be reduced.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Figure 1:
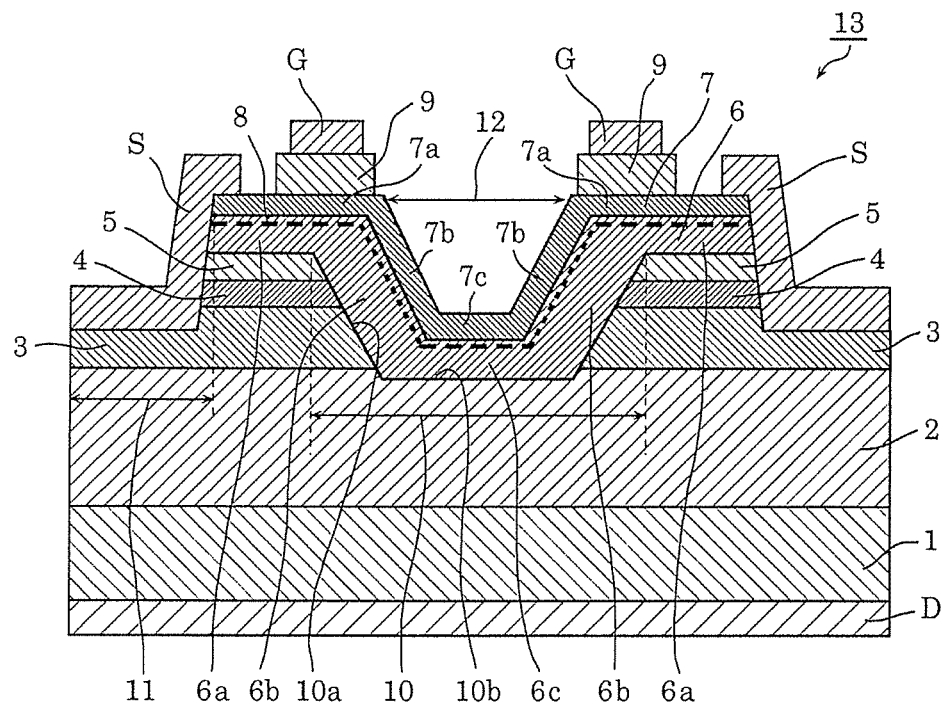
FIG. 1 is a cross-sectional diagram of a semiconductor device according to Embodiment 1 of the present disclosure.

Hereinafter, exemplary embodiments of a semiconductor device according to the present disclosure are described in detail with reference to the accompanying drawings. It should be noted that each of the exemplary embodiments below describes only a preferred specific example. Therefore, the numerical values, shapes, materials, structural elements, the arrangement and connection of the structural elements, steps, the processing order of the steps, and so forth described in the following exemplary embodiments are merely examples, and are not intended to limit the present disclosure. Thus, among the structural elements in the following exemplary embodiments, structural elements that are not recited in any one of the independent claims indicating top concepts according to the present disclosure are described as arbitrary structural elements.

Note that each of the drawings is only a schematic diagram and is not necessarily precise illustration. Thus, the reduction scales and the like in the drawings do not always agree with each other. Note also that, in all the drawings, the same reference numerals are given to the substantially same structural elements and redundant description thereof shall be omitted or simplified. Moreover, the term "approximately" as in "approximately parallel" is used in the embodiments described below. For example, the meaning of the term "approximately parallel" includes not only "completely parallel" but also "substantially parallel". More specifically, the meaning of this term includes a case where a small percent difference is present with respect to the "completely parallel" state. The same applies to the other terms using "approximately" in the embodiments described below.

Furthermore, the terms "upward" and "downward" are used in the present specification. Note that these terms do not refer to an upward direction (vertically upward) and a downward direction (vertically downward) in an absolute space recognition. More specifically, these terms in the present specification are defined depending on a relative position relationship based on an order in which layers are laminated in a laminate structure. Note also that the terms "upward" and "downward" are used not only in the case where two structural elements are disposed to leave a space between these elements so that a different structural element is present between the two structural elements, but also in the case where the two structural elements are disposed to be in absolute contact with each other.

Moreover, AlGaN described in the present specification refers to a three-element mixed crystal of $Al_xGa_{1-x}N$ (where x is a value expressed by $0 \leq x \leq 1$). In the following description, a multi-element mixed crystal is abbreviated by a sequence of symbols of the constituent elements, such as AlInN or GaInN. For example, a nitride semiconductor of $Al_xGa_{1-x-y}In_yN$ (where x and y are values expressed by $0 \leq x \leq 1$, $0 \leq y \leq 1$, and $0 \leq x+y \leq 1$) is abbreviated as AlGaInN.

[Underlying Knowledge Forming Basis of the Present Disclosure]

Figure 9:
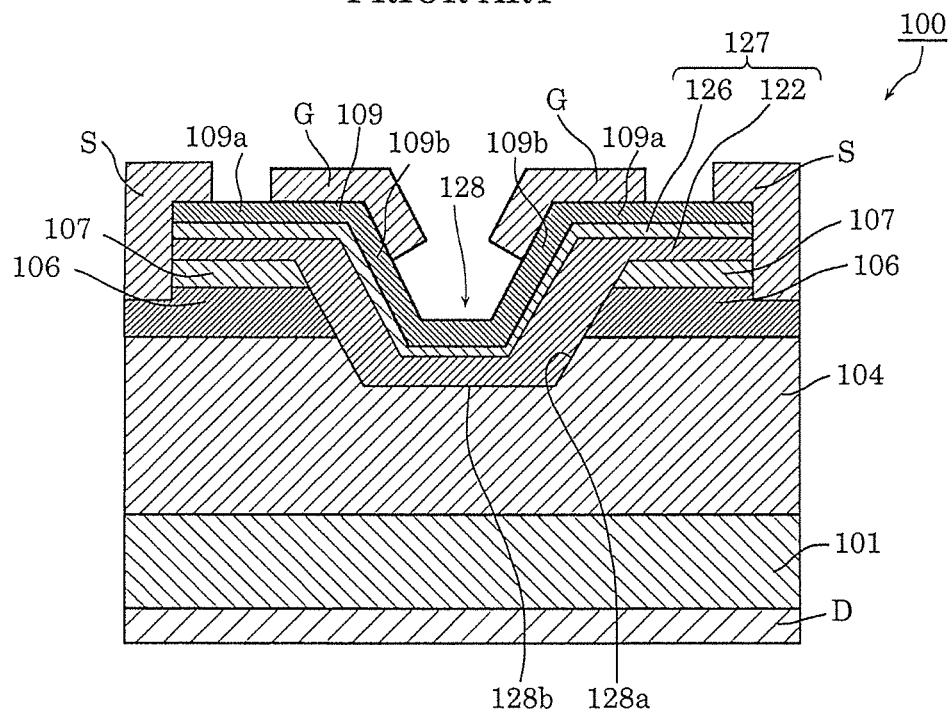
FIG. 9 is a cross-sectional diagram of a conventional semiconductor device.
Figure 10:
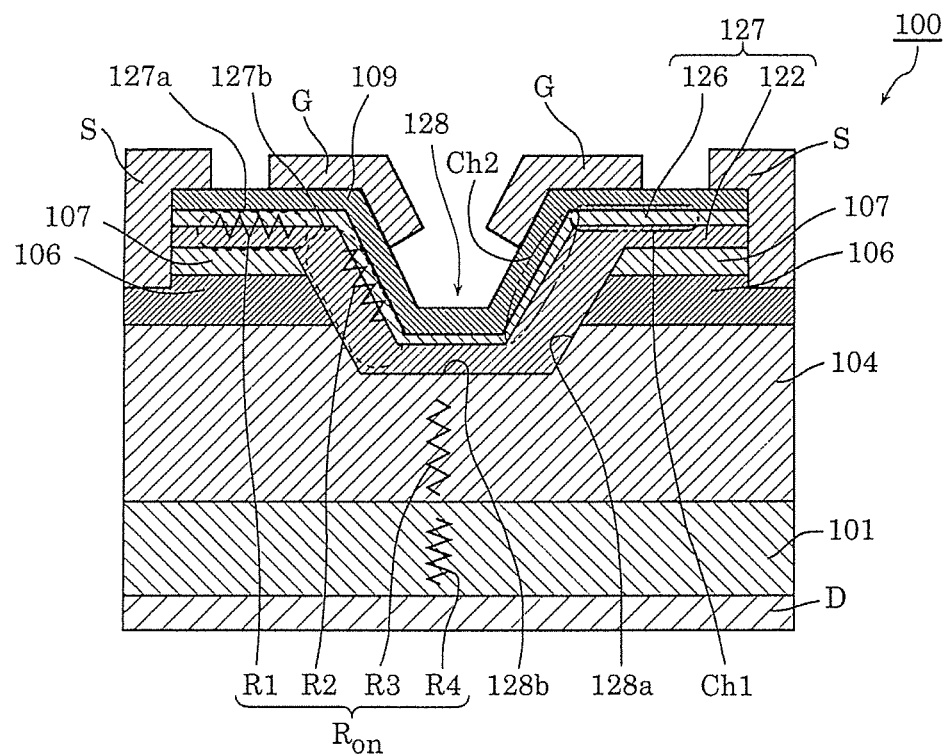
FIG. 10 is a cross-sectional diagram showing electrical characteristics of the conventional semiconductor device.

FIG. 9 is a cross-sectional diagram of conventional semiconductor device 100 disclosed in PTL 1. FIG. 10 is a cross-sectional diagram showing electrical characteristics of conventional semiconductor device 100.

Semiconductor device 100 is a so-called vertical transistor. As shown in FIG. 9, semiconductor device 100 includes GaN substrate 101 which is electrically conductive. On GaN substrate 101, n⁻-type GaN drift layer 104, p-type GaN barrier layer 106, and n⁺-type GaN contact layer 107 are disposed in this order. Moreover, semiconductor device 100 includes gate opening 128 which has side surface 128a and bottom surface 128b and which reaches from n⁺-type GaN contact layer 107 to n⁻-type GaN drift layer 104.

Semiconductor device 100 includes regrown layer 127 which is formed to cover gate opening 128. Regrown layer 127 includes intrinsic (i)-type GaN electron transit layer 122 and AlGaN electron supply layer 126 which are laminated sequentially. Moreover, insulation layer 109 is formed on AlGaN electron supply layer 126. As shown in FIG. 9, each of i-type GaN electron transit layer 122, AlGaN electron supply layer 126, and insulation layer 109 has a recessed region to fit on gate opening 128. For example, insulation layer 109 has upper surface 109a and side surface 109b.

Furthermore, semiconductor device 100 includes gate electrode G, source electrode S, and drain electrode D. Gate electrode G is formed across upper surface 109a and side surface 109b of insulation layer 109. Source electrode S is formed on side surfaces of layers from AlGaN electron supply layer 126 to p-type GaN barrier layer 106. Drain electrode D is formed on a backside surface of GaN substrate 101.

On-resistance Ron of conventional semiconductor device 100 is calculated by adding the following resistances obtained when a gate voltage exceeds a threshold and the transistor is thereby turned on. To be more specific, as shown in FIG. 10, on-resistance Ron is calculated by adding the following: resistance R1 of an interface between i-type GaN electron layer 122 and AlGaN electron supply layer 126 of regrown layer 127, the interface being located outside with respect to gate opening 128; resistance R2 of an interface between i-type GaN electron layer 122 and AlGaN electron supply layer 126 on side surface 127b of regrown layer 127, the interface being located inside with respect to gate opening 128; resistance R3 of n⁻-type GaN drift layer 104 in the vertical direction; and resistance R4 of GaN substrate 101 in the vertical direction.

Conventional semiconductor device 100 shown in FIG. 9 and FIG. 10 has upper surface 127a that is a part of regrown layer 127 and that is located outside with respect to gate opening 128. Upper surface 127a exhibits crystal growth in a c-plane direction. On this account, upper surface 127a has large spontaneous polarization and large piezoelectric polarization, and thereby easily causes 2-dimensional electron gas (hereinafter, referred to as 2DEG). On the other hand, side surface 127b that is a part of regrown layer 127 and corresponds to a side surface of gate opening 128 exhibits crystal growth in a non-polar or semipolar direction, such as a direction perpendicular to a c-axis (an a-plane, for example) or diagonally to the c-axis (an m-plane, for example). On this account, side surface 127b has small polarization and thus hardly causes 2DEG.

On-off control is performed on upper surface 127a and side surface 127b of regrown layer 127 by the same gate electrode G via insulation layer 109. Although upper surface 127a and side surface 127b are different in charge density of 2DEG (hereinafter, referred to as the amount of 2DEG), insulation layer 109 is disposed on both upper surface 127a and side surface 127b in the same manner. Thus, upper surface 127a and side surface 127b have mutually different thresholds of the gate voltage. For example, having a large amount of 2DEG, upper surface 127a has a small threshold. On the other hand, having a small amount of 2DEG, side surface 127b has a large threshold.

With this, when the gate voltage of the transistor is increased from a voltage in an off-state, the gate voltage of upper surface 127a firstly exceeds the threshold and thus the resistance is reduced. At this time, however, the gate voltage of side surface 127b does not exceed the threshold and thus the resistance remains high. With an increase in the gate voltage, the gate voltage of side surface 127b exceeds the threshold and thus the resistance is reduced.

Figure 11:
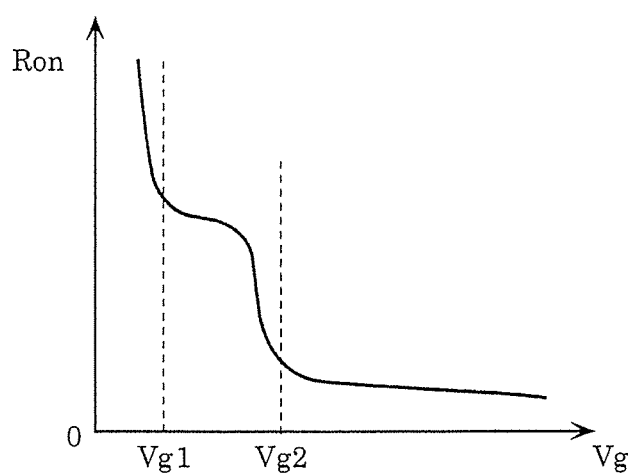
FIG. 11 is a graph showing a relationship between gate voltage and on-resistance of the conventional semiconductor device.

The present inventors studied the relationship between gate voltage Vg and on-resistance Ron actually using conventional semiconductor device 100. The result of the study is shown in FIG. 11. Here, FIG. 11 is a graph showing the relationship between gate voltage Vg and on-resistance Ron of conventional semiconductor device 100.

As shown in the graph of FIG. 11, conventional semiconductor device 100 has two different threshold voltages Vg1 and Vg2. As described above, Vg1 is the threshold voltage of upper surface 127a that has the large amount of 2DEG, and Vg2 is the threshold voltage of side surface 127b that has the small amount of 2DEG.

As described thus far, conventional semiconductor device 100 needs to exceed the two thresholds until the resistance is reduced and the transistor is completely brought into the on-state. For this reason, conventional semiconductor device 100 has a disadvantage that the gate voltage to drive the transistor is high. Here, with an increase in the gate drive voltage of a normally-off transistor, drive loss to drive the transistor increases.

In view of the state problem, the present disclosure provides a semiconductor device (transistor) which can reduce drive loss by reducing a gate drive voltage.

Embodiment 1

The following describes a semiconductor device according to Embodiment 1 of the present disclosure, with reference to the accompanying drawings.
[Configuration]
FIG. 1 is a cross-sectional diagram of semiconductor device 13 according to Embodiment 1.

As shown in FIG. 1, semiconductor device 13 according to the present embodiment includes: substrate 1; drift layer 2 which is an example of a first nitride semiconductor layer; first underlayer 3 which is an example of a second nitride semiconductor layer; block layer 4; and second underlayer 5. Moreover, semiconductor device 13 includes: first regrown layer 6 which is an example of an electron transit layer; second regrown layer 7 which is an example of a first electron supply layer; and insulation layer 9. Furthermore, semiconductor device 13 includes gate electrode G, source electrode S, and drain electrode D. Moreover, semiconductor device 13 includes first opening 10 and source opening (second opening) 11. Semiconductor device 13 according to the present embodiment is a so-called vertical transistor.

To be more specific, semiconductor device 13 includes substrate 1 on which drift layer 2, first underlayer 3, block layer 4, and second underlayer 5 are disposed in this order. First opening 10 is formed to penetrate second underlayer 5, block layer 4, and first underlayer 3 to reach drift layer 2. First regrown layer 6 is disposed above substrate 1, and second regrown layer 7 is disposed on first regrown layer 6. First regrown layer 6 and second regrown layer 7 are formed to cover first opening 10 and an upper surface of second underlayer 5. Source opening 11 is formed to penetrate second regrown layer 7, first regrown layer 6, second underlayer 5, and block layer 4 to reach first underlayer 3. Gate electrode G is disposed above second regrown layer 7 via insulation layer 9. Source electrode S is disposed to cover source opening 11. Drain electrode D is disposed on a backside surface of substrate 1.

Hereinafter, a specific configuration is described in detail for each of the layers included in semiconductor device 13.

Substrate 1 has a first main surface on one side and a second main surface on an opposite side, and is of a first conductivity type. On the first main surface, drift layer 2 is formed. A plane direction of the first main surface is the [0001] (that is, c-plane) direction. On the second main surface (the backside surface), drain electrode D is formed. In the present embodiment, the first conductivity type refers to the $n^+$ type. Substrate 1 is formed from, for example, $n^+$-type GaN.

It should be noted that "p-type" and "n-type" refer to conductivity types of semiconductor layers. Here, $n^+$ represents a so-called heavily doped state in which an excessive amount of n-type dopant is added to the semiconductor layer. Moreover, $n^-$ represents a so-called lightly doped state in which an excessively small amount of n-type dopant is added to the semiconductor layer. Opposite-conductivity types of n-type, $n^+$ type, and $n^-$ type are p-type, $p^+$ type, and $p^-$ type.

Drift layer 2 is an example of the first nitride semiconductor layer disposed on the first main surface of substrate 1. For example, drift layer 2 is formed from n-type GaN having a thickness of 8 μm.

Drift layer 2 is formed by, for example, a crystal growth method called an organometallic vapor-phase epitaxy (MOVPE) method. First underlayer 3, block layer 4, and second underlayer 5 are formed by this method as well.

A donor concentration of drift layer 2 is, for example, from $1*10^{15}$ cm$^{-3}$ to $1*10^{17}$ cm$^{-3}$ inclusive. A carbon (C) concentration of drift layer 2 is, for example, from $1*10^{15}$ cm$^{-3}$ to $2*10^{17}$ cm$^{-3}$ inclusive.

First underlayer 3 is disposed on drift layer 2, and is an example of the second nitride semiconductor layer which is of a second conductivity type opposite to the first conductivity type. For example, first underlayer 3 is formed from p-type GaN having a thickness of 400 nm.

First underlayer 3 is formed by a crystal growth method, such as the MOVPE method, for example. However, the method is not limited to this. First underlayer 3 may be formed by, instead of the crystal growth method, injecting magnesium (Mg) into i-type GaN, for example. In addition, first underlayer 3 may be an insulation layer formed by ion implantation with iron (Fe) into i-type GaN instead of p-type GaN.

For example, suppose that first underlayer 3 is a p-type GaN layer. In this case, when a reverse voltage is applied (when a high voltage is applied to source electrode S), this means that a high voltage is applied to a p-type part of a p-n junction semiconductor formed from first underlayer 3 and drift layer 2. Thus, a depletion layer is extended, and thereby higher breakdown voltage can be achieved.

On the other hand, suppose that first underlayer 3 is an insulation layer formed by ion implantation with Fe, for example. The breakdown voltage depends on only the thickness of first underlayer 3. Unlike the case of p-type GaN, the depletion layer is not extended to drift layer 2. Thus, the breakdown voltage can be enhanced by increasing the thickness of first underlayer 3.

Hence, in terms of miniaturization of semiconductor device 13, first underlayer 3 may be a p-type GaN layer to achieve high breakdown voltage.

Block layer 4 is disposed between first regrown layer (electron transit layer) 6 and first underlayer 3. More specifically, block layer 4 is disposed on first underlayer 3. Block layer 4 is formed from an insulating or semi-insulating nitride semiconductor. Block layer 4 is a nitride semiconductor layer having a thickness of 200 nm, for example.

Block layer 4 can suppress an occurrence of a parasitic npn structure, and thus can reduce influence of a malfunction caused by the parasitic npn structure.

Suppose that semiconductor device 13 does not include block layer 4. In this case, the following laminated structure is disposed between source electrode S and drain electrode D. The layers in the laminated structure are disposed in the following order from top to bottom: second regrown layer 7; first regrown layer 6; second underlayer 5 (n-type); first underlayer 3 (p-type); and drift layer 2 (n-type). Here, first regrown layer 6 and second regrown layer 7 are formed by a crystal regrowth method. This laminated structure is a parasitic npn structure (a parasitic bipolar transistor). When semiconductor device 13 is in an off state and a current passes through first underlayer 3, this parasitic bipolar transistor may be turned on and then reduce the breakdown voltage of semiconductor device 13. This causes semiconductor device 13 to be susceptible to malfunctions. Here, when an influence of the parasitic bipolar transistor is sufficiently small, semiconductor device 13 may not need to include block layer 4.

Block layer 4 may be formed from any insulating or semi-insulating material. For example, block layer 4 may be a carbon-doped GaN layer. A carbon concentration of block layer 4 may be at least $3*10^{17}$ cm$^{-3}$, for example. Alternatively, the carbon concentration of block layer 4 may be at least $1*10^{18}$ cm$^{-3}$. In this case, a concentration of silicon (Si) or oxygen (O) which is an n-type impurity is lower than the carbon concentration. The silicon or oxygen concentration may be $5*10^{16}$ cm$^{-3}$ or lower, or $2*10^{16}$ cm$^{-3}$ or lower, for example.

Moreover, at least one of iron (Fe), magnesium (Mg), and boron (B) may be added to block layer 4. To be more specific, block layer 4 may be formed by ion implantation with Mg, Fe, or B into a GaN layer. The ion type used in the ion implantation may be any type that can achieve high resistivity. The same effect can be achieved using a different ion type other than the aforementioned type.

Second underlayer 5 is disposed between first regrown layer (electron transit layer) 6 and first underlayer (second nitride semiconductor layer) 3. To be more specific, second underlayer 5 is a nitride semiconductor layer disposed on block layer 4. Second underlayer 5 is formed from AlGaN having a thickness of 20 nm, for example.

Second underlayer 5 has a function of suppressing diffusion of impurity, such as p-type impurity (Mg, for example), from first underlayer 3. Moreover, second underlayer 5 has a function as an electron supply layer for a channel described later. In the present embodiment, second underlayer 5 is an example of the second electron supply layer, and has a larger band gap than second regrown layer (first electron supply layer) 7.

In the present embodiment shown in FIG. 1, first opening 10 having a recessed shape is formed to penetrate, from the upper surface of second underlayer 5, second underlayer 5, block layer 4, and first underlayer 3 to reach drift layer 2. First opening 10 has side surface 10a and bottom surface 10b. Side surface 10a corresponds to end surfaces of second underlayer 5, block layer 4, and first underlayer 3. Bottom surface 10b corresponds to a partial surface included in drift layer 2 and exposed to first opening 10.

First opening 10 is formed so that an opening area of first opening 10 increases with distance from substrate 1. To be more specific, side surface 10a is inclined with respect to the upper surface of second underlayer 5. More specifically, the end surfaces that are included in second underlayer 5, block layer 4, and first underlayer 3 and that face first opening 10 are inclined. Bottom surface 10b is approximately parallel to the first main surface of substrate 1. First opening 10 has an inverted trapezoidal shape in cross section, for example.

After the layers from drift layer 2 to second underlayer 5 are formed sequentially on the first main surface of substrate 1, first opening 10 is formed by etching second underlayer 5, block layer 4, and first underlayer 3 so that drift layer 2 is partially exposed. First opening 10 is formed in a predetermined shape by patterning using photolithography or by dry etching, for example.

First regrown layer 6 is a nitride semiconductor layer formed by the crystal regrowth method to cover an upper surface of first underlayer 3 and first opening 10. In the present embodiment, first regrown layer 6 is formed along the upper surface of second underlayer 5 and a surface of first opening 10. First regrown layer 6 is formed from, for example, GaN having a thickness of 100 nm.

A film thickness of first regrown layer 6 is approximately uniform. Thus, first regrown layer 6 is formed to have a recess along the surface of first opening 10. To be more specific, first regrown layer 6 has upper surface 6a, side surface 6b, and bottom surface 6c as shown in FIG. 1. Upper surface 6a and bottom surface 6c are parallel to the first main surface of substrate 1 (that is, the c-plane). Side surface 6b is inclined with respect to the upper surface of second underlayer layer 5 (that is, the c-plane). Side surface 6b of first regrown layer 6 is approximately parallel to side surface 10a of first opening 10. Bottom surface 6c of first regrown layer 6 is approximately parallel to bottom surface 10b of first opening 10.

First regrown layer 6 includes a channel and functions as an electron transit layer. First regrown layer 6 includes 2-dimensional electron gas layer 8 formed as the channel, near an interface between first regrown layer 6 and second regrown layer 7.

For example, first regrown layer 6 may be undoped or partially formed into an n-type layer using, for example, Si dope. Moreover, a regrown AlN layer having a thickness of 1 nm may be formed between first regrown layer 6 and second regrown layer 7. This regrown AlN layer can suppress alloy scattering and thereby enhance channel mobility.

Second regrown layer 7 is a nitride semiconductor layer formed by the crystal regrowth method to cover the upper surface of first underlayer 3 and first opening 10. In the present embodiment, second regrown layer 7 is formed along the upper surface of second underlayer 5 and the surface of first opening 10. More specifically, second regrown layer 7 is formed on first regrown layer 6 along a surface of first regrown layer 6. Second regrown layer 7 is formed from, for example, AlGaN having a thickness of 50 nm.

A film thickness of second regrown layer 7 is approximately uniform. Thus, second regrown layer 7 is formed to have a recess along the surface of first opening 10. To be more specific, second regrown layer 7 has upper surface 7a, side surface 7b, and bottom surface 7c as shown in FIG. 1. Upper surface 7a and bottom surface 7c are parallel to the first main surface of substrate 1 (that is, the c-plane). Side surface 7b is inclined with respect to the upper surface of second underlayer layer 5 (that is, the c-plane). Side surface 7b of second regrown layer 7 is approximately parallel to side surface 10a of first opening 10. Bottom surface 7c of second regrown layer 7 is approximately parallel to bottom surface 10b of first opening 10.

In this way, gate opening 12 is formed by second regrown layer 7 above first opening 10. As with first opening 10, gate opening 12 is formed so that an opening area of gate opening 12 increases with distance from substrate 1.

Second regrown layer 7 functions as an electron supply layer (first electron supply layer) for the channel.

It should be noted that not only second regrown 7, but also second underlayer 5 functions as an electron supply layer in the present embodiment. Each of second regrown layer 7 and second underlayer 5 is formed from AlGaN. However, Al compositions of second regrown layer 7 and second underlayer 5 are not particularly limited. For example, the Al composition of second regrown layer 7 may be 20% and the Al composition of second underlayer 5 may be about 25%.

In the present embodiment, source opening (second opening) 11 is formed to penetrate, from the upper surface of second regrown layer 7, second regrown layer 7, first regrown layer 6, second underlayer 5, and block layer 4 to reach first underlayer 3, as shown in FIG. 1. A cross-sectional shape of source opening 11 is an inverted trapezoid, for example, and is not limited to this.

Insulation layer 9 is disposed between gate electrode G and second regrown layer (first electron supply layer) 7, and formed selectively on upper surface 7a of second regrown layer 7 and not formed on side surface 7b of second regrown layer 7. Insulation layer 9 is formed using an insulating material, such as silicon nitride (SiN) or silicon oxide ($SiO_2$).

The insertion of insulation layer 9 in this way can suppress a gate current and shift the threshold in a normal direction, allowing semiconductor device 100 to operate in a normally-off operation.

Gate electrode G is disposed above second regrown layer 7. To be more specific, gate electrode G is disposed selectively on upper surface 7a second regrown layer 7 and not disposed on side surface 7b of second regrown layer 7. In other words, gate electrode G is not provided on side surface 7b. Moreover, gate electrode G is not provided on bottom surface 7c either. Gate electrode G is provided only on upper surface 7a. For example, gate electrode G is formed to encompass gate opening 12 in plan view.

Gate electrode G is formed using a conducting material, such as metal. For example, gate electrode G may be formed from palladium (Pd). In addition to Pd, examples of the material of gate electrode G include a nickel (Ni)-based material, tungsten silicide (WSi), and gold (Au). For example, gate electrode G is formed by patterning a conductive film that is formed by sputtering or evaporation.

Source electrode S is disposed to cover source opening 11, and is electrically connected to first underlayer (second nitride semiconductor layer) 3. To be more specific, source electrode S is formed to cover a part of second regrown layer 7, an entire side surface of source opening 11, and an entire bottom surface of source opening 11. More specifically, source electrode S contacts second regrown layer 7, first regrown layer 6, second underlayer 5, and block layer 4, on the side surface of source opening 11.

Source electrode S is formed using a conducting material, such as metal. Examples of the material of source electrode S include a material that forms an ohmic contact with an n-type nitride semiconductor layer (including GaN, AlN, and AlGaN), such as Ti/Al. For example, source electrode S is formed by patterning a conductive film that is formed by sputtering or evaporation.

Drain electrode D is disposed on the second main surface (the backside surface) of substrate 1. Drain electrode D is formed using a conducting material, such as metal. As in the case of source electrode S, examples of the material of drain electrode D include a material that forms an ohmic contact with an $n^-$-type layer. For example, drain electrode D is formed from a conductive film by sputtering or evaporation.

[Comparative Discussion]

Hereinafter, on-resistance characteristics of semiconductor device 13 according to the present embodiment are explained by comparison with those of conventional semiconductor device 100, with reference to FIG. 2, FIG. 3, and FIG. 9 to FIG. 11.

Figure 2:
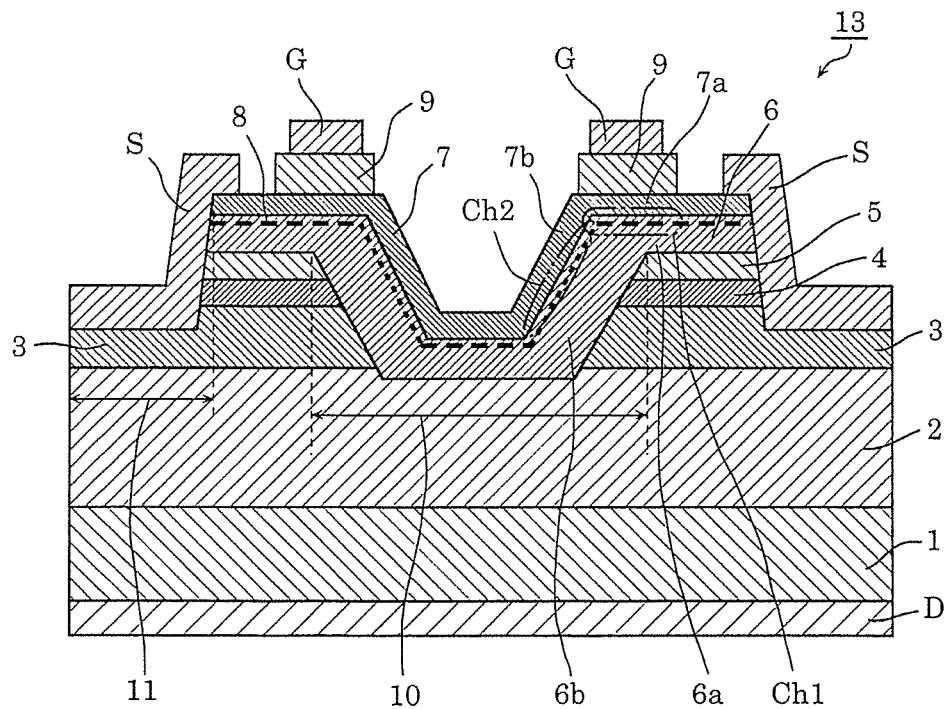
FIG. 2 is a cross-sectional diagram showing electrical characteristics of the semiconductor device according to Embodiment 1 of the present disclosure.
Figure 3:
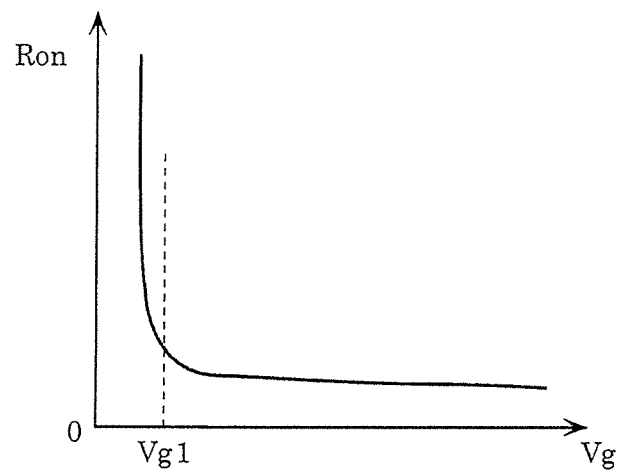
FIG. 3 is a graph showing a relationship between gate voltage and on-resistance of the semiconductor device according to Embodiment 1 of the present disclosure.

FIG. 2 is a cross-sectional diagram showing electrical characteristics of semiconductor device 13 according to the present embodiment. FIG. 3 is a graph showing a relationship between gate voltage Vg and on-resistance Ron of semiconductor device 13 according to the present embodiment. It should be noted that, in FIG. 2, some of the numerical values indicating the layers are omitted for the sake of brevity.

As shown in FIG. 2, semiconductor device 13 includes channel regions Ch1 and Ch2 along 2-dimensional electron gas layer 8. Channel region Ch1 is located straight down from gate electrode G. To be more specific, channel region Ch1 is formed near an interface between upper surface 6a of first regrown layer 6 and upper surface 7a of second regrown layer 7.

Channel region Ch2 is formed in a side surface of gate opening 12. To be more specific, channel region Ch2 is formed near an interface between side surface 6b of first regrown layer 6 and side surface 7b of second regrown layer 7.

As shown in FIG. 3, semiconductor device 13 according to the present embodiment has only one threshold, that is, threshold Vg1. On the other hand, conventional semiconductor device 100 has two thresholds Vg1 and Vg2 as shown in FIG. 11. The reason for this is as follows.

Gate electrode G included in semiconductor device 13 according to the present embodiment is selectively disposed on upper surface 7a of second regrown layer 7 and not disposed on side surface 7b or bottom surface 7c. Thus, semiconductor device (transistor) 13 is turned on and off only by a 2DEG channel (channel region Ch1) located straight down from gate electrode G.

This is because, since the polarization of the nitride semiconductor layer that exhibits crystal growth on the c-plane is large, a large amount of 2DEG is caused near the interface between first regrown layer 6 and second regrown layer 7 on the c-plane (or more specifically, in channel region Ch1) and thus the threshold voltage decreases. On the other hand, gate electrode G is not provided on side surface 7b of gate opening 12 and therefore channel region Ch2 in side surface 7b is always in the on-state.

Hence, semiconductor device 13 can be turned on and off with a small threshold voltage. On this account, a gate drive voltage to activate semiconductor device 13 can be reduced. Then, because semiconductor device 13 is driven by a low gate voltage in this way, drive loss can be thus reduced. Moreover, since gate electrode G is selectively disposed on upper surface 7a of second regrown layer 7, an area covered by gate electrode G is small. With this, the gate current can be suppressed and an input capacity can also be reduced.

[Advantageous Effects Etc.]

As described above, semiconductor device 13 according to the present embodiment includes: substrate 1 which has the first main surface on one side and the second main surface on the opposite side, and which is of the first conductivity type; drift layer 2 which is disposed on the first main surface of substrate 1; first underlayer 3 which is disposed on drift layer 2 and is of the second conductivity type opposite to the first conductivity type; first opening 10 which has a recessed shape and penetrates first underlayer 3 to reach drift layer 2; first regrown layer 6 including a nitride semiconductor and disposed above substrate 1, and second regrown layer 7 including a nitride semiconductor and disposed on first regrown layer 6, first regrown layer 6 and second regrown layer 7 covering the upper surface of first underlayer 3 and first opening 10 and being formed along the upper surface of first underlayer 3 and a recessed surface of first opening 10; gate electrode G which is disposed above second regrown layer 7; source opening 11 which is disposed separately from gate electrode G, has a recessed shape, and penetrates second regrown layer 7 and first regrown layer 6 to reach first underlayer 3; source electrode S which is disposed to cover source opening 11 and electrically connected to first underlayer 3; and drain electrode D which is disposed on the second main surface of substrate 1. Second regrown layer 7 has upper surface 7a which is approximately parallel to the first main surface and side surface 7b which is formed along the side surface of first opening 10. Gate electrode G is disposed selectively on upper surface 7a and not disposed on side surface 7b.

With this configuration, the resistance of channel region Ch2 of gate opening 12 is maintained low all the time. Thus, channel region Ch2 is not turned on or off by a voltage applied to gate electrode G. More specifically, only channel region Ch1 in a position corresponding to upper surface 7a is turned on and off. On account of this, to reduce on-resistance Ron of semiconductor device 13 (transistor), only one threshold is used. Moreover, gate electrode G is provided above the interface between first regrown layer 6 and second regrown layer 7 above which the amount of 2DEG is large, or more specifically, provided above upper surface 7a. Thus, the threshold can be small. With this, the gate drive voltage of the normally-off semiconductor device, for example, can be reduced and thus drive loss can also be reduced.

Moreover, semiconductor device 13 further includes, for example, insulation layer 9 which is disposed between gate electrode G and second regrown layer 7, and formed selectively on upper surface 7a and not formed on side surface 7b.

With this, a gate current can be suppressed and the threshold can be shifted in the normal direction. Thus, semiconductor device 13 can operate in the normally-off operation.

Furthermore, semiconductor device 13 further includes, for example, second underlayer 5 which is disposed between first regrown layer 6 and first underlayer 3 and which has a larger band gap than second regrown layer 7.

With second underlayer (second electron supply layer) 5 having a larger band gap, diffusion of p-type impurity (Mg, for example) from first underlayer 3 can be suppressed.

Moreover, semiconductor device 13 further includes, for example, block layer 4 which is disposed between first regrown layer 6 and first underlayer 3 and which is formed from an insulating or semi-insulating nitride semiconductor.

With this, an occurrence of a parasitic npn structure (or more specifically, a parasitic bipolar transistor) can be suppressed. Thus, the breakdown voltage of semiconductor device 13 can be prevented from decreasing and thereby an occurrence of a malfunction can be suppressed.

Furthermore, the carbon concentration of block layer 4 is at least $3*10^{17}$ cm$^{-3}$, for example.

With this, the insulation property of block layer 4 can be enhanced and thus the occurrence of a parasitic npn structure can be further suppressed.

Moreover, at least one of Fe, Mg, and B may be added to block layer 4, for example.

With this, the insulation property of block layer 4 can be enhanced and thus the occurrence of a parasitic npn structure can be further suppressed.

Embodiment 2

Figure 4:
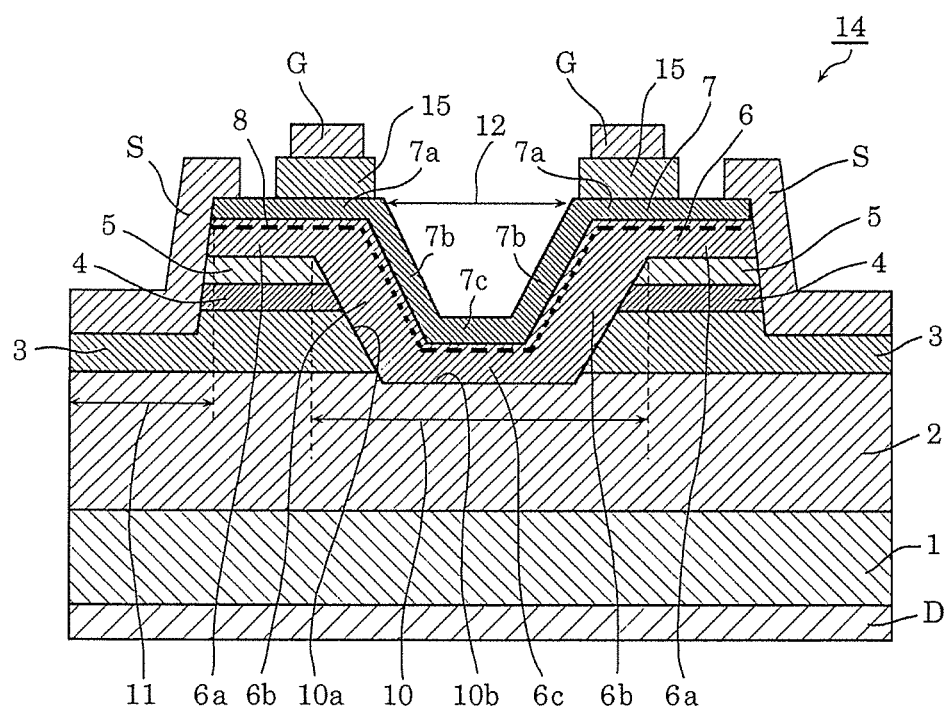
FIG. 4 is a cross-sectional diagram of a semiconductor device according to Embodiment 2 of the present disclosure.

Next, a semiconductor device according to Embodiment 2 of the present disclosure is described, with reference to the drawing. FIG. 4 is a cross-sectional diagram of semiconductor device 14 according to the present embodiment. Semiconductor device 14 according to Embodiment 2 is different from semiconductor device 13 according to Embodiment 1 in that a third nitride semiconductor layer which is of the second conductivity type (or more specifically, the p type) is provided instead of insulation layer 9. The following mainly describes differences between Embodiment 1 and Embodiment 2, and thus similarities between Embodiment 1 and Embodiment 2 may be omitted or simplified.

Control layer 15 is formed from a p-type nitride semiconductor that is formed by the crystal regrowth method, for example. As the p-type nitride semiconductor forming control layer 15, p-type AlGaN is used, for example. Control layer 15 is continuously formed on second regrown layer 7 by the crystal growth method.

In the present embodiment, control layer 15 is disposed between gate electrode G and second regrown layer (first electron supply layer) 7, and formed selectively on upper surface 7a and not formed on side surface 7b. To be more specific, the p-type AlGaN layer formed on side surface 7b and bottom surface 7c is removed by, for example, dry etching so that the p-type AlGaN layer is selectively left only on a position straight down from gate electrode G, that is, only on upper surface 7a. Control layer 15 is formed into a desirable shape by patterning. Control layer 15 is not formed to extend to side surface 7b of second regrown layer 7. Moreover, control layer 15 does not have direct contact with source electrode S. After control layer 15 is formed by patterning, gate electrode G is formed on control layer 15.

In the present embodiment, gate electrode G is formed only on control layer 15. For example, gate electrode G is smaller than control layer 15 formed by patterning. Gate electrode G is formed so that no side of gate electrode G extends beyond control layer 15 to contact second regrown layer 7.

Gate electrode G is formed using a conducting material that forms an ohmic contact with the p-type AlGaN layer, for example. Examples of the conducting material include Pd, a Ni-based material, WSi, and Au.

As described above, semiconductor device 14 according to the present embodiment further includes control layer 15 which is of the second conductivity type and which is disposed between gate electrode G and second regrown layer 7, and formed selectively on upper surface 7a and not formed on side surface 7b.

In this way, control layer 15 formed from p-type AlGaN is disposed between gate electrode G and second regrown layer 7. This increases the potential of the part corresponding to the channel. As a result, the threshold voltage can be increased and thereby the normally-off operation of semiconductor device 14 can be achieved.

Embodiment 3

Next, Embodiment 3 according to the present disclosure is described, with reference to the drawing. In the present embodiment, a plane arrangement (layout) of chip 16 is described with reference to FIG. 5. Here, chip 16 is a single chip that includes a plurality of semiconductor devices 13 according to Embodiment 1 of the present disclosure or a plurality of semiconductor devices 14 according to Embodiment 2 of the present disclosure.

Figure 5:
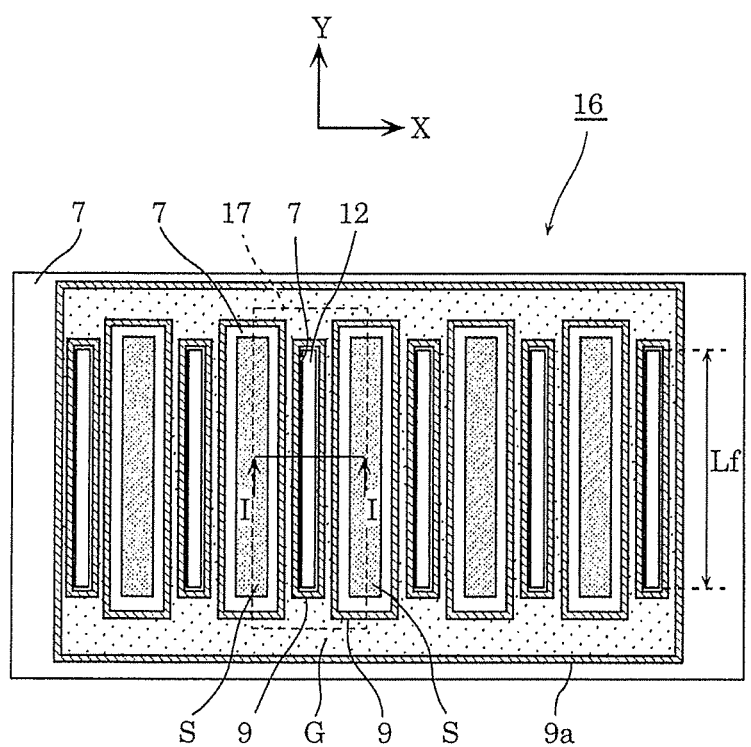
FIG. 5 is a top view showing a layout of a chip according to Embodiment 3 of the present disclosure.

FIG. 5 is a top view showing a layout of chip 16 according to the present embodiment. More specifically, FIG. 5 is a top view showing semiconductor devices 13 or 14 seen from the direction of gate electrode G. Here, to make the shapes of the layers included in semiconductor device 13 or 14 easy to see, a different shading pattern is used for each of the layers in FIG. 5. The same applies to FIG. 6 and FIG. 7 which are described later. It should be noted in FIG. 5 that an X direction refers to a <1-100> direction and that a Y direction refers to a <11-20> direction. Note also that "– (minus)" in the parentheses < > indicates a bar.

Chip 16 shown in FIG. 5 includes a plurality of semiconductor devices 13 which are disposed in the X direction. A region enclosed by a dashed line indicates unit cell 17. A cross-sectional view of unit cell 17 taken along line I-I corresponds to the cross-sectional view of semiconductor device 13 shown in FIG. 1. In the case where control layer 15 is provided instead of insulation layer 9, a cross-sectional view of unit cell 17 taken along line I-I corresponds to the cross-sectional view of semiconductor device 14 shown in FIG. 4.

As shown in FIG. 5, insulation layer 9a is disposed on second regrown layer 7 (not shaded). Moreover, gate electrode G (shaded with coarse dots), source electrode S (shaded with fine dots), insulation layer 9 (diagonally hatched) or control layer 15, and gate opening 12 (not shaded) are disposed to be enclosed by insulation layer 9a. As shown in FIG. 5, unit cell 17 is a single cell and includes the layers, such as the electrodes, which are disposed sequentially. For example, half of source electrode S, gate electrode G, gate opening 12, gate electrode G, and half of source electrode S are disposed in this order.

To increase a gate width, chip 16 has a configuration of an array in which a plurality of unit cells 17 (the plurality of semiconductor devices 13 or 14) are arranged in the X direction.

Suppose that a length of gate opening 12 in unit cell 17 in the Y direction is finger length Lf. Since unit cell 17 includes two transistors, the gate width of chip 16 is obtained by doubling finger length Lf and then multiplying this doubled length by the number of unit cells 17.

It should be noted that both sides of the transistor included in unit cell 17 are terminated with gate electrodes G. Moreover, in unit cell 17, two gate electrodes G extend in the Y direction and are connected to each other at respective both ends. In a region in which the respective ends of gate electrodes G are connected to each other, gate electrodes G are formed on upper surface 7a of second regrown layer 7. To be more specific, gate electrode G is not provided in gate opening 12, or more specifically, not on side surface 7b or bottom surface 7c. As shown in FIG. 5, gate electrode G is in the shape of a ladder in the X direction in plan view. The region in which gate electrodes G in unit cell 17 are connected to each other is disposed so as not to contact source electrode S.

Variation of Embodiment 3

Next, Variation of Embodiment 3 according to the present disclosure is described, with reference to the drawings. In the present variation, a plane arrangement (layout) of chip 18 is described with reference to FIG. 6 and FIG. 7. Here, chip 18 is a single chip that includes a plurality of semiconductor devices 13 according to Embodiment 1 of the present disclosure or a plurality of semiconductor devices 14 according to Embodiment 2 of the present disclosure.

Figure 6:
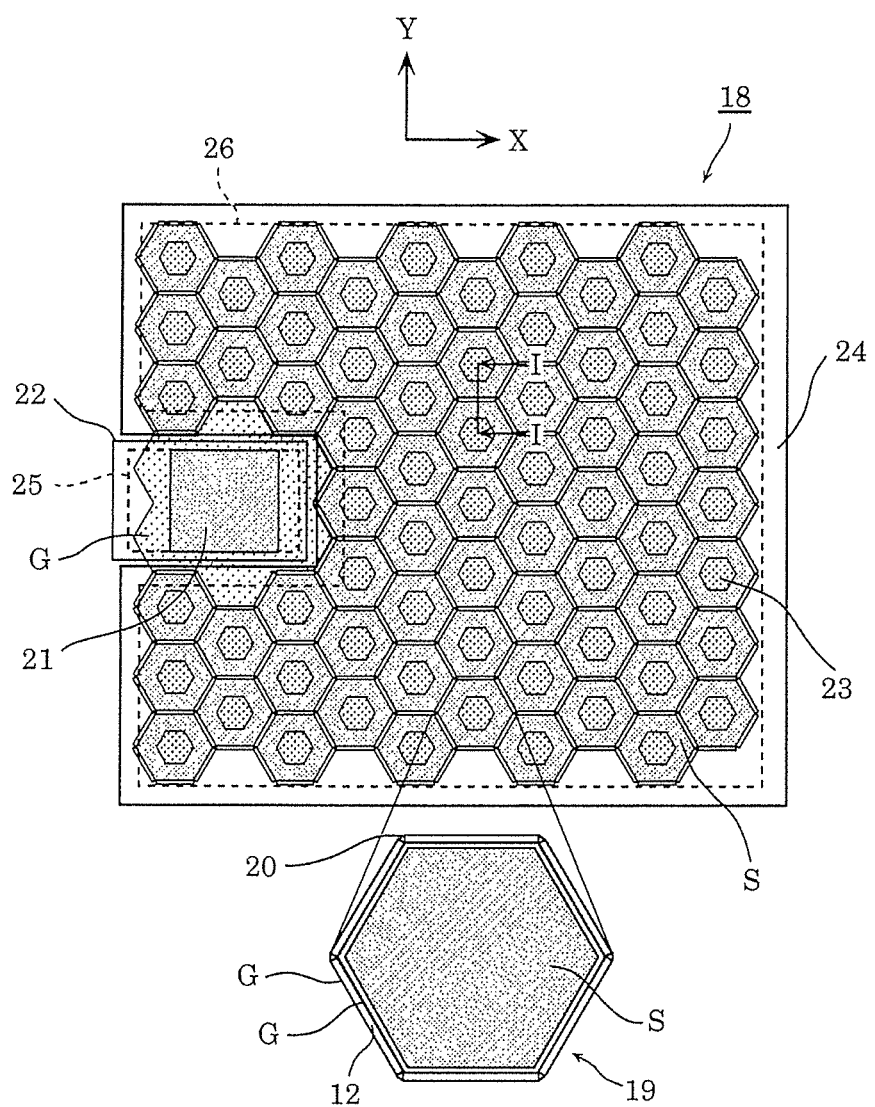
FIG. 6 is a top view showing a layout of a chip according to Variation of Embodiment 3 of the present disclosure.
Figure 7:
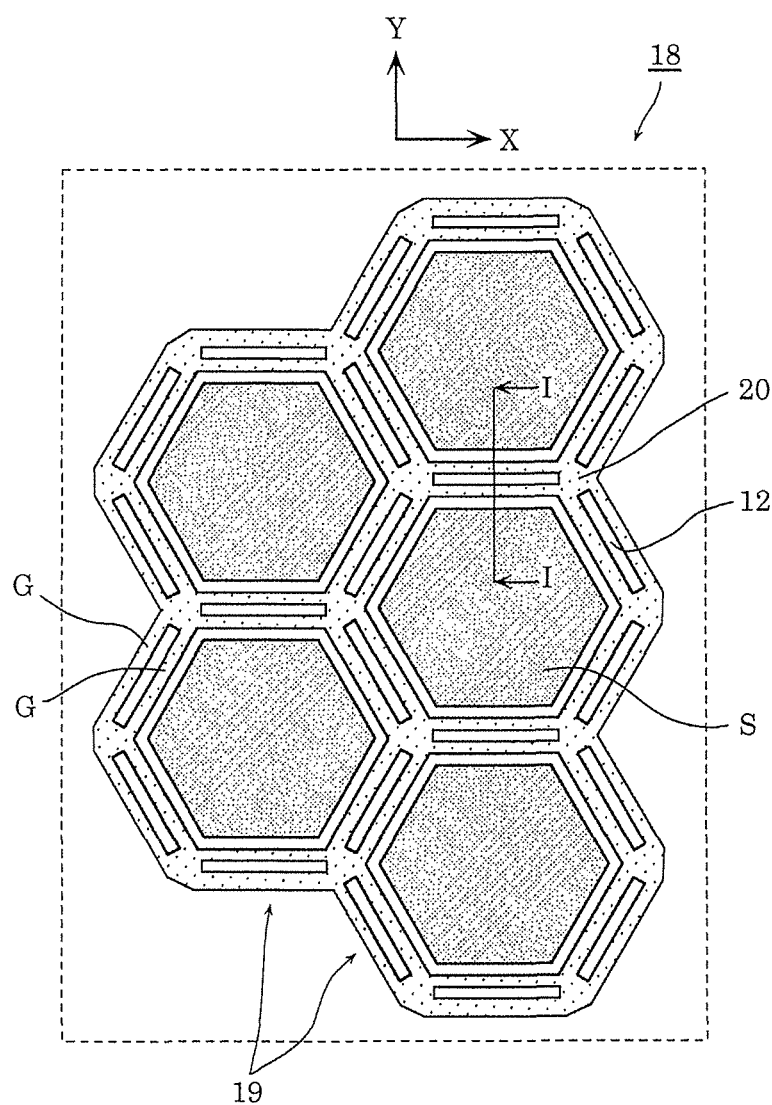
FIG. 7 is an enlarged view showing the layout of the chip according to Variation of Embodiment 3 of the present disclosure.

FIG. 6 is a top view showing a layout of chip 18 according to the present variation. FIG. 7 is an enlarged view of a part shown in FIG. 6. In FIG. 6 and FIG. 7, the X direction refers to the <1-100> direction and the Y direction refers to the <11-20> direction.

In the present variation shown in FIG. 6 and FIG. 7, unit cell 19 is a single cell and includes: source electrode S which is hexagonal in plan view; two gate electrodes G disposed around a periphery of source electrode S; and gate opening 12 formed between two gate electrodes G. Here, two gate electrodes G each of which has the same length as each side of source electrode S are disposed for each peripheral side of source electrode S. That way, gate electrodes G disposed around the periphery are merely isolated lines. Thus, gate electrode terminal 20, which is an equilateral triangle in plan view, is disposed so that gate electrodes G of adjacent sides can remain the same length and be connected to each other. As shown in FIG. 6, gate electrode terminals 20 each having the shape of an equilateral triangle allow gate electrodes G to be disposed in patterns without misalignment when unit cells 19 are arranged in an array so that gate electrodes G overlap one another.

After a large island is formed from gate electrode G as shown in FIG. 6, gate electrode G is connected to gate electrode lead wire 22 via gate electrode via 21. Moreover, each of source electrodes S of unit cells 19 arranged in the array is connected to source electrode lead wire 24 via source electrode via 23. Source electrode lead wire 24 is disposed not to contact gate electrode G and draws a current from each of source electrodes S of all unit cells 19.

As described above, chip 18 according to the present variation includes gate electrode via 21, gate electrode lead wire 22, source electrode via 23, and source electrode lead wire 24. Furthermore, as shown in FIG. 6, chip 18 includes gate pad 25, source pad 26, and a drain pad (not illustrated). Here, the drain pad is disposed on a backside surface of chip 18.

Gate pad 25 is provided above gate electrode lead wire 22 and electrically conductive with gate electrode lead wire 22. Moreover, source pad 26 is formed to encompass gate pad 25 in an approximately laterally-facing U-shape and electrically conductive with source electrode lead wire 24.

It should be noted that a cross-sectional view along line I-I in FIG. 6 and FIG. 7 corresponds to the cross-sectional view of semiconductor device 13 shown in FIG. 1 or the cross-sectional view of semiconductor device 14 shown in FIG. 4.

Embodiment 4

Figure 8:
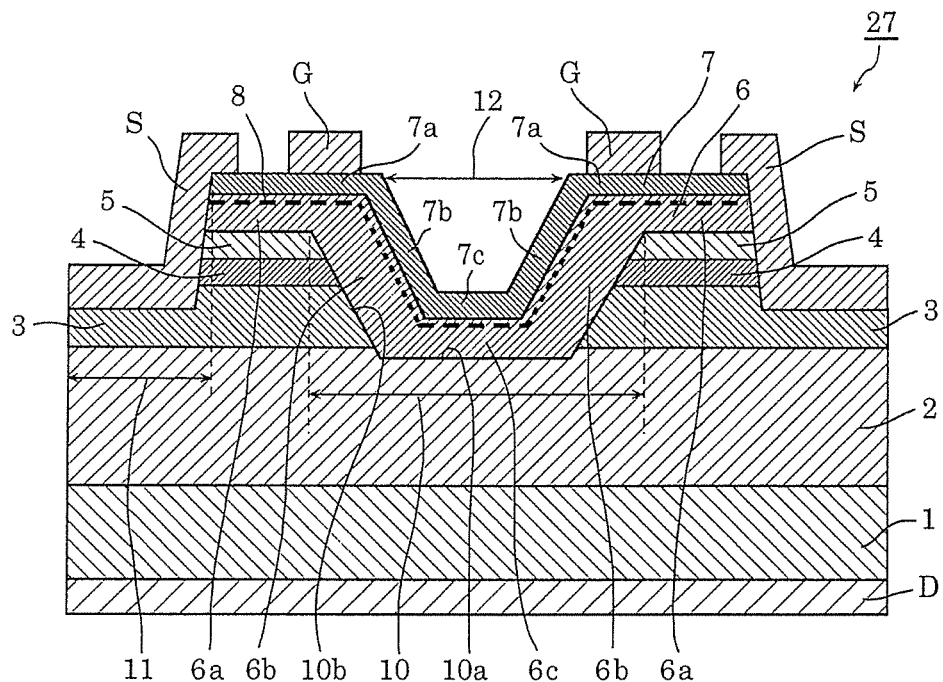
FIG. 8 is a cross-sectional diagram of a semiconductor device according to Embodiment 4 of the present disclosure.

Next, Embodiment 4 according to the present disclosure is described, with reference to the drawing. FIG. 8 is a cross-sectional diagram of semiconductor device 27 according to the present embodiment. Semiconductor device 27 according to Embodiment 4 is different from semiconductor device 13 according to Embodiment 1 in that insulation layer 9 is not provided. To be more specific, the difference is that gate electrode G is in direct contact with second regrown layer 7 (upper surface 7a) in the present embodiment.

To achieve the normally-off operation, this configuration may have a disadvantage. However, since gate electrode G is in direct contact with second regrown layer 7, an advantageous effect of semiconductor device 27 can be further enhanced.

Others

Although the semiconductor device according to the present disclosure in an aspect or aspects has been described by way of Embodiments and Variation above, it should be obvious that the present disclosure is not limited to Embodiments and Variation described above.

For example, the first conductivity type is described as the n, $n^+$, or $n^-$ type and the second conductivity type is described as the p, p+, or p− type in the above embodiments and variation. However, the present disclosure is not limited to this. The first conductivity type may be the p, p+, or p− type and the second conductivity type may be the n, n+, or n− type.

Other embodiments implemented through various changes and modifications conceived by a person of ordinary skill in the art or through a combination of arbitrary structural elements or functions in different embodiments and variation described above may be included in the scope in an aspect or aspects according to the present disclosure, unless such changes, modification, and combination depart from the scope of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor device according to the present disclosure is useful as, for instance, a power device used in, for example, a power supply circuit of consumer equipment, such as a television set.

What is claimed is:

1. A semiconductor device, comprising:
   a substrate which has a first main surface on one side and a second main surface on an opposite side, and which is of a first conductivity type;
   a first nitride semiconductor layer which is disposed on the first main surface of the substrate;
   a second nitride semiconductor layer which is disposed on the first nitride semiconductor layer;
   a first opening which has a recessed shape and penetrates the second nitride semiconductor layer to reach the first nitride semiconductor layer;
   an electron transit layer including a nitride semiconductor and disposed above the substrate, and a first electron supply layer including a nitride semiconductor and disposed on the electron transit layer, the electron transit layer and the first electron supply layer covering an upper surface of the second nitride semiconductor layer and the first opening and being formed along the upper surface of the second nitride semiconductor layer and a recessed surface of the first opening;
   a gate electrode which is disposed above the first electron supply layer;
   a second opening which is disposed separately from the gate electrode, has a recessed shape, and penetrates the first electron supply layer and the electron transit layer to reach the second nitride semiconductor layer;
   a source electrode which is disposed to cover the second opening and electrically connected to the second nitride semiconductor layer; and
   a drain electrode which is disposed on the second main surface of the substrate,
   wherein the first electron supply layer has an upper surface which is approximately parallel to the first main surface and a side surface which is formed along a side surface of the first opening, and
   the gate electrode is disposed selectively on the upper surface of the first electron supply layer and not disposed on the side surface of the first electron supply layer,
   the semiconductor device further comprises an insulation layer or a third nitride semiconductor layer which is of a second conductivity type opposite to the first conductivity type, and
   the insulation layer or the third nitride semiconductor layer is disposed between the gate electrode and the first electron supply layer, and formed selectively on the upper surface of the first electron supply layer and not formed on the side surface of the first electron supply layer.

2. The semiconductor device according to claim 1, further comprising:
   a second electron supply layer which is disposed between the electron transit layer and the second nitride semiconductor layer, and has a larger band gap than the first electron supply layer.

3. The semiconductor device according to claim 1, further comprising:
   a block layer which is disposed between the electron transit layer and the second nitride semiconductor layer, and formed from one of an insulating nitride semiconductor and a semi-insulating nitride semiconductor.

4. The semiconductor device according to claim 3, wherein the block layer has a carbon concentration of at least $3*10^{17}$ cm$^{-3}$.

5. The semiconductor device according to claim 3, wherein at least one of iron (Fe), magnesium (Mg), and boron (B) is added to the block layer.

6. The semiconductor device according to claim 1, wherein the gate electrode and the insulation layer or the third nitride semiconductor layer are disposed adjacent a periphery and on both sides of the first opening.

7. The semiconductor device according to claim 1, wherein the gate electrode and the insulation layer or the third nitride semiconductor layer are not disposed inside the first opening.

* * * * *